United States Patent
Changey et al.

(10) Patent No.: US 6,274,451 B1
(45) Date of Patent: Aug. 14, 2001

(54) METHOD OF FABRICATING A GATE-CONTROL ELECTRODE FOR AN IGBT TRANSISTOR

(75) Inventors: Nicolas Changey, rue de Navarre; Alain Petitbon, rue des Menuets; Sophie Crouzy, Bures-sur-Yvette; Eric Ranchy, Villejuif, all of (FR)

(73) Assignee: Alstom Holdings, Paris (FR)

( * ) Notice: Subject to any disclaimer, the term of this patent is extended or adjusted under 35 U.S.C. 154(b) by 0 days.

(21) Appl. No.: 09/429,030

(22) Filed: Oct. 29, 1999

(30) Foreign Application Priority Data

Oct. 30, 1998 (FR) .................................................. 98 13691

(51) Int. Cl.[7] ........................ H01L 21/331; H01L 21/336
(52) U.S. Cl. ........................ 438/309; 438/268; 438/273; 438/305; 438/586
(58) Field of Search ........................... 438/309, 15, 301, 438/212, 156, 479, 967, 133, 257, 164, 300, 305, 268, 273, 586

(56) References Cited

U.S. PATENT DOCUMENTS

| 5,126,806 | * | 6/1992 | Sakurai et al. | 257/577 |
|---|---|---|---|---|
| 5,319,237 | | 6/1994 | Legros . | |
| 5,391,908 | * | 2/1995 | Walker et al. | 257/409 |
| 5,404,040 | * | 4/1995 | Hshieh et al. | 257/341 |
| 5,451,798 | * | 9/1995 | Tsuda et al. | 257/139 |
| 5,521,406 | * | 5/1996 | Tserng et al. | 257/276 |

FOREIGN PATENT DOCUMENTS

| 2335953 | 7/1977 | (FR) . |
|---|---|---|
| 98 02 925 | 1/1998 | (WO) . |

OTHER PUBLICATIONS

Patent Abstracts of Japan, vol. 098, No. 006, Apr. 30, 1998; & JP 10 056131 A (Denso corp), Feb. 24, 1998.

* cited by examiner

*Primary Examiner*—Matthew Smith
*Assistant Examiner*—Igwe U. Anya
(74) *Attorney, Agent, or Firm*—Sughrue, Mion, Zinn, Macpeak & Seas, PLLC

(57) ABSTRACT

This method of fabricating a gate-control electrode (28) for an insulated-gate bipolar transistor, from a plate of electrically conducting material which is covered with an electrically insulating layer (22) and, on one of its large faces, delimits a connection pad intended to be soldered to the gate, includes the steps consisting in, on the pad, forming an electrically conductive layer (30) covering the electrically insulating layer (22), on the plate, forming an electrically conductive track for supplying the connection pad, and burying the supply track.

8 Claims, 2 Drawing Sheets

METHOD OF FABRICATING A GATE-CONTROL ELECTRODE FOR AN IGBT TRANSISTOR

BACKGROUND OF THE INVENTION

The present invention relates to a method of fabricating a gate-control electrode for an insulated-gate bipolar transistor (IGBT).

This type of transistor is generally mounted on an integrated-circuit wafer provided with emitter, collector and gate-control electrodes which are soldered to corresponding connection locations of the wafer.

During operation, the gate-control electrode selectively controls the transition of the IGBTs to the closed or open state. It must necessarily be insulated from the emitter and collector electrodes.

BRIEF SUMMARY OF THE INVENTION

The object of the invention is to provide a method of fabricating a gate-control electrode for an IGBT, making it possible, from a plate of electrically conducting material which is covered with an electrically insulating layer and, on one of its large faces, delimits a connection pad intended to be soldered to the gate, to produce a gate-control electrode insulated from the rest of the plate.

It therefore relates to a method of fabricating a gate-control electrode for an insulated-gate bipolar transistor, characterized in that it includes the steps consisting in:

on the connection pad, forming an electrically conductive layer covering the electrically insulating layer;

on the plate, forming an electrically conductive track for supplying the connection pad; and burying the supply track.

The fabricating method according to the invention may furthermore have one or more of the following characteristics, taken individually or in any technically feasible combination.

the plate is made of an anodized metallic material, in particular aluminium, the electrically conductive layer and the supply track being formed by local metallization of the anodized layer, the local metallization of the anodized layer is carried out by laser processing, subsequent to the laser processing of the anodized layer, a layer of metal is deposited on the track which is formed, it furthermore includes a step consisting in burying the supply track under a second electrically insulating layer, the step consisting in burying the supply track consists in anodizing the latter, furthermore, a layer of antioxidant material is deposited on the pad, the antioxidant material is selected from nickel, chromium, gold, or an alloy of these materials.

BRIEF DESCRIPTION OF THE DRAWINGS

Further characteristics and advantages will become apparent from the following description, which is given solely by way of example and with reference to the appended drawings, in which.

DESCRIPTION OF PREFERRED EMBODIMENTS

Figure 1:
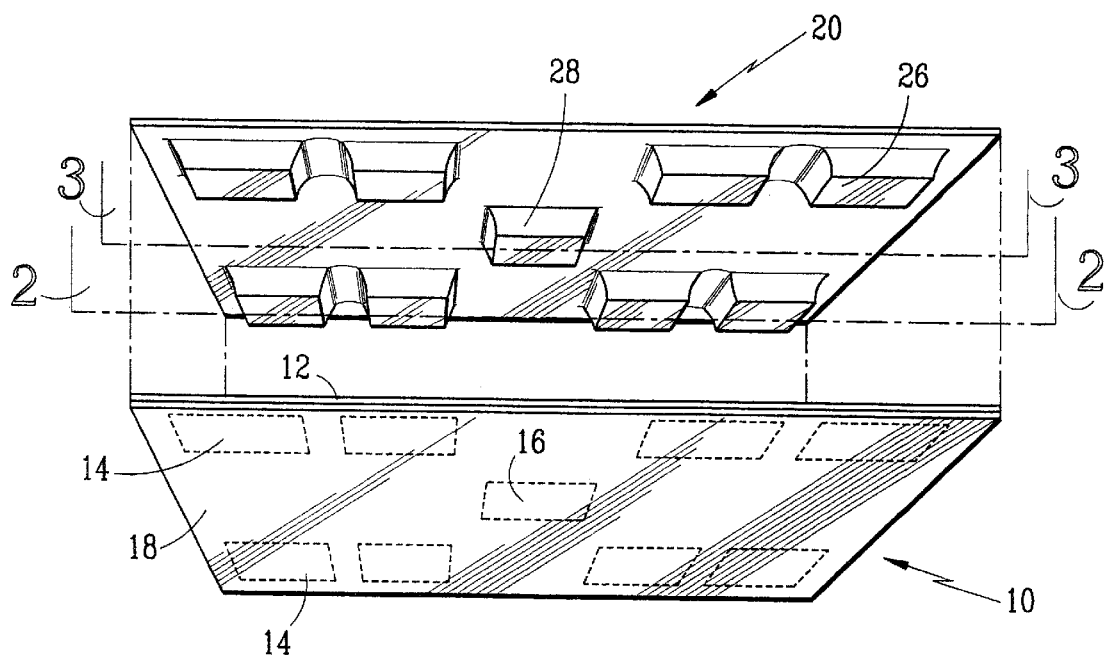
FIG. 1 is a schematic perspective view of an integrated-circuit wafer equipped with IGBT transistors and a plate defining emitter and gate-control electrodes.

FIG. 1 represents an integrated-circuit wafer, denoted by the general numerical reference 10.

It consists of a conventional type of wafer, made from a silicon wafer in which insulated-gate bipolar transistor chips (not shown in this figure) are produced by conventional techniques.

The wafer 10 has a passivation layer 12, made for example of polyamide, covering the majority of one of the large faces of the wafer 10 so as to insulate the underlying silicon.

Interruption zones in the passivation layer 12 define a set of connection locations, such as 14, for connecting emitter electrodes and a connection location 16 for connecting a gate-control electrode.

As is conventional, the connection locations 14 and 16 are covered with a layer of aluminium in order to protect the underlying silicon.

The opposite large face of the wafer 10 is provided with a metal plate 18 constituting a collector electrode.

Figure 2:
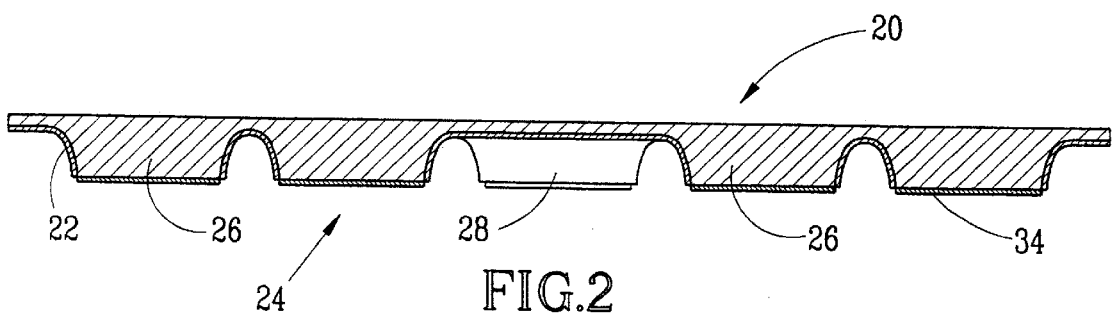
FIG. 2 is a view in section on the plane 2—2 of the plate in FIG. 1.
Figure 3:
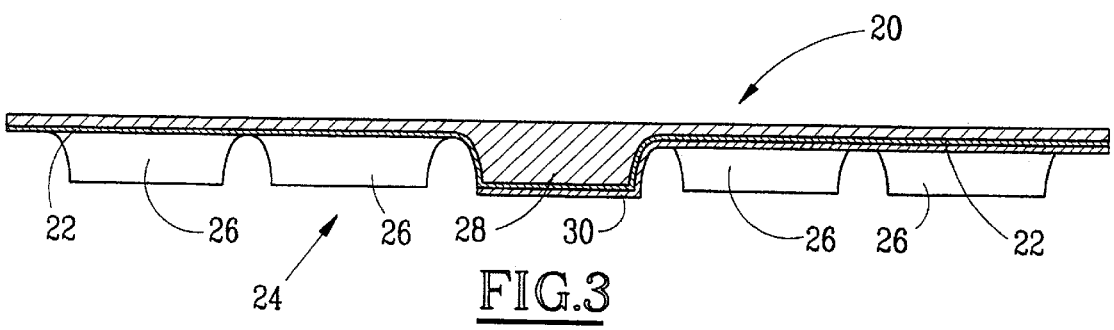
FIGS. 3, 4, 5 and 6 are views in section on the plane 3—3 of the plate in FIG. 1, showing the various steps in the production of the gate-control electrode and of the emitter electrodes.

Also referring to FIGS. 2 and 3, the emitter and gate-control electrodes are produced in a single piece 20 in the form of a plate of electrically conducting material, for example aluminium.

Although this plate 20 can be made from any other type of material suitable for the use in question, it will be assumed in the rest of the description that it is made of aluminium which has been anodized so as to proof it against oxidation, that is to say having an outer layer 22 of alumina (FIGS. 2 and 3).

The large face 24 of the plate 20, facing the integrated-circuit wafer 10, has a set of connection pads, such as 26 and 28, some of which 26 constitute emitter electrodes, and the other 28 of which constitutes a gate-control electrode, these pads being soldered to the connection locations 14 and 16 made in the wafer 10.

The production process for the plate 20 will now be described in detail with reference to FIGS. 3 to 6, in which some of the details have been exaggerated for the sake of clarity.

Referring first to FIG. 3, the first production phase consists in forming a plate 20 of anodized aluminium having, on one of its large faces 24, the pads 26 forming emitter electrodes as well as the pad 28 forming a gate-control electrode.

As mentioned above, the plate 20 is externally covered with an anodized passivation layer 22 of alumina so as to make it inert.

This layer 22 is then metallized locally so as to form a supply track 30 for the pad 28 forming the gate-control electrode, this track 30 also covering this pad 28.

This track 30 is produced, for example, using an excimer or ultraviolet laser capable of surface-decomposing the alumina constituting the layer 22 in order to reform aluminium in such a way as to make it conductive.

During the next step, the track 30 is anodized so as to bury it in order to electrically insulate it from the outside.

Figure 4:
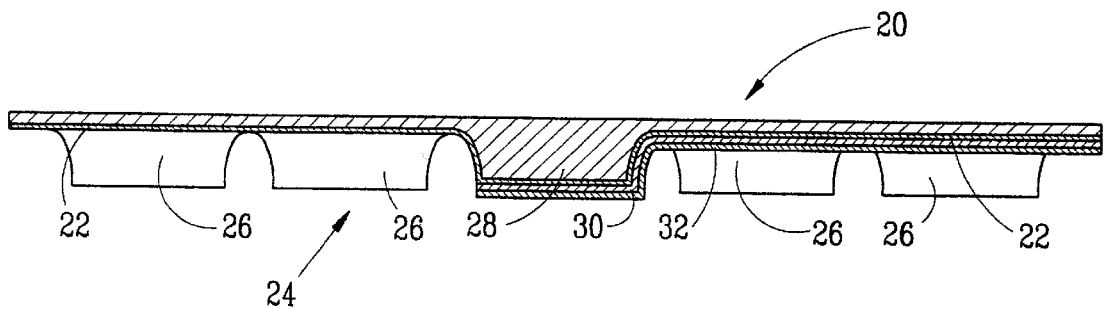

This provides the plate 20 which can be seen in FIG. 4, in which the track 30 is covered with a layer of alumina 32.

As a variant, if the passivation layer 22 is not thick enough so that it can, after formation of the track 30, undergo anodization while keeping a sufficient thickness of aluminium in the track 30, then before this anodization a layer of aluminium is deposited after the step of metallizing the anodized layer 22.

Figure 5:
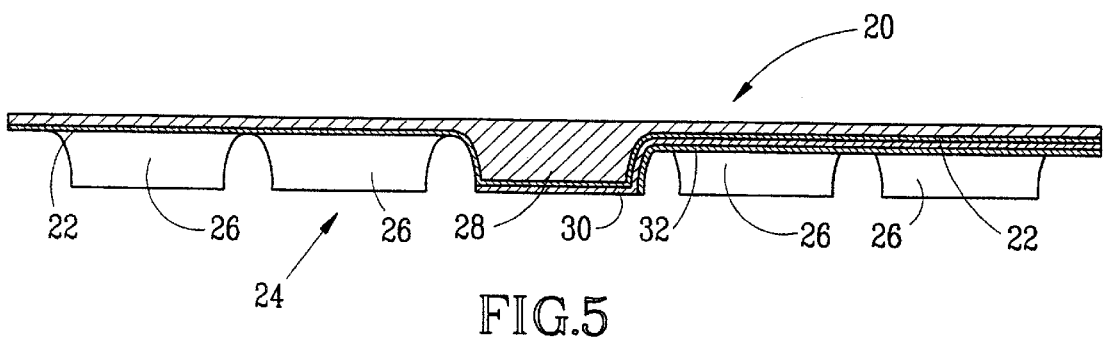

The plate 20 then undergoes a phase of machining the pads 26 and 28 so as to expose the underlying aluminium. The plate 20 represented in FIG. 5 is thus obtained, in which the metal layer constituting the supply track and covering the gate-control pad 28 extends between two electrically insulating layers obtained by anodization.

The final step consists in covering the pads 26 and 28 with a layer 34 of antioxidant material which is furthermore capable of allowing the pads to be soldered to the connection locations 14 and 16 (FIG. 1).

For example, the layer of antioxidant material consists of nickel, chromium, gold, or an alloy of these metals.

Figure 6:
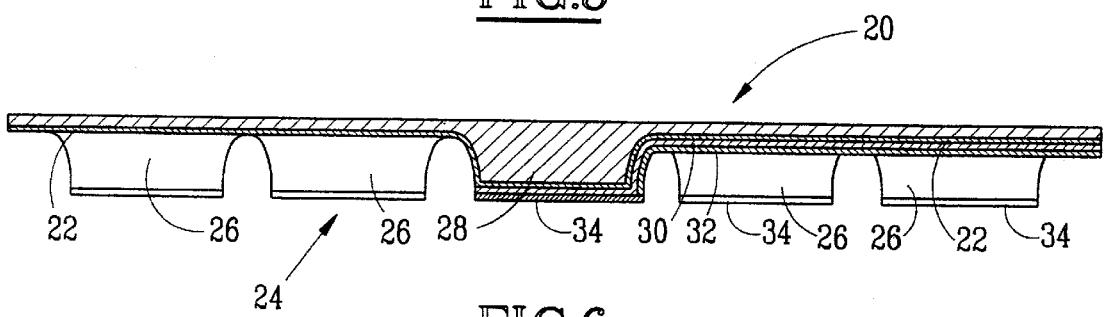

The plate 20 thus obtained, which can be seen in FIG. 6, has a set of integral pads 26 which are soldered to the corresponding connection locations 14 with a view to supplying the IGBT chip emitter, as well as a pad 28 constituting a gate-control electrode which is soldered to the corresponding connection location 16.

This gate-control pad 28 is insulated from the rest of the plate 20 by anodized layers 22 and 32 and is associated with a supply track 30 which is itself insulated from the rest of the plate 20 by the second anodized layer 32.

In order to solder the plate 20 to the integrated-circuit wafer 10, the connection locations 14 and 16 should first be deoxidized, for example by soaking the wafer 10 in a nitric acid bath, preferably for 30 seconds.

A layer of antioxidant material is deposited on the deoxidized connection locations 14 and 16, for example the same material as that used to make the connection pads 26 and 28 of the plate 20 inoxidizable, that is to say nickel, chromium, gold or an alloy of these metals.

Soldering preforms are then deposited on the connection locations 14 and 16, for example ones made of SnPbAg.

After having positioned the plate 20 on the wafer 10 so that the connection pads 26 and 28 of the plate 20 are applied against the corresponding connection locations 14 and 16 of the integrated-circuit wafer 10, the combination is placed in an oven with a view to soldering the assembly.

It will be noted that the metal plate 18 constituting the collector electrode is preferably soldered simultaneously with the soldering of the plate 20 to the integrated-circuit wafer 10.

It can be seen that the invention which has just been described allows the emitters of IGBT chips to be supplied with a relatively heavy current, up to a few hundreds of amperes, since the emitter electrodes are produced in a single piece, and while retaining the possibility of providing a gate-control electrode integrated with the plate, while being insulated from the rest of it.

Figure 7:
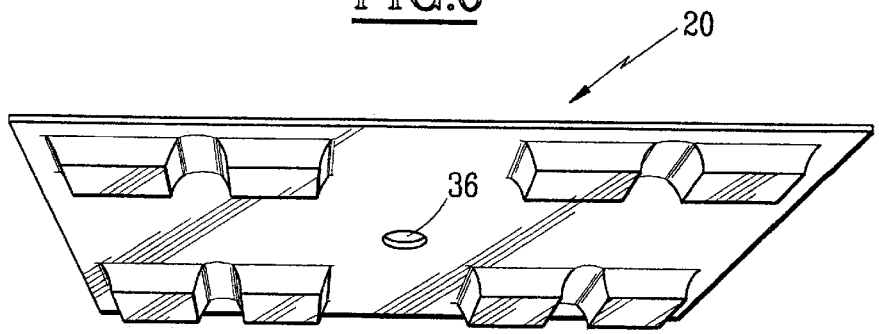
FIG. 7 is a schematic perspective view of another embodiment of the plate in FIG. 1.

It is however possible, as a variant, and as represented in FIG. 7, to provide access for soldering a gate-control electrode separate from the emitter electrodes, by making a hole 36 in the plate 20 so as to allow an electrode (not shown) to be passed through, with the interposition of an electrically insulating material.

From the description of the plate given above, it can be seen that the large face of the plate 20 opposite the connection pads 26 and 28 may be provided with suitable cooling means, thus allowing a significant increase in the number of chips integrated with the wafer 10, since it is possible to pass a relatively heavy supply current through the plate 20.

For example, the cooling means may be configured in the form of channels through which a coolant, for example deionized water, is circulated.

It will lastly be noted that the plate forming the emitter and gate-control electrodes can be soldered to commercially available integrated-circuit wafers.

The invention is not limited to the embodiments which have been described. Indeed, it is possible to produce the insulating layers extending on either side of the supply track using a different technique, in particular by depositing a suitable electrically insulating coating.

What is claimed is:

1. Method of fabricating a gate-control electrode (28) for an insulated-gate bipolar transistor, from a plate (20) of electrically conducting material which is covered with an electrically insulating layer and, on one of its large faces, delimits a connection pad intended to be soldered to the gate, characterized in that it includes the steps consisting in:

on the connection pad, forming an electrically conductive layer (30) covering the electrically insulating layer (22);

on the plate, forming an electrically conductive supply track for supplying the connection pad; and burying the supply track.

2. Method according to claim 1, characterized in that the plate (20) is made of an anodized metallic material, the electrically conductive layer (30) and the supply track being formed by local metallization of the electrically insulating layer (22).

3. Method according to claim 2, characterized in that the local metallization of the electrically insulating layer (22) is carried out by laser processing.

4. Method according to claim 3, characterized in that, subsequent to the laser processing of electrically insulating layer (22), a layer of metal is deposited on the track which is formed.

5. Method according to claim 1, characterized in that it furthermore includes a step consisting in burying the supply track under a second electrically insulating layer (32).

6. Method according to claim 5, characterized in that the step consisting of burying the supply track (30) consists of anodizing the latter.

7. Method according to claim 1, characterized in that it furthermore includes a step consisting in depositing a layer (34) of antioxidant material on the pad.

8. Method according to claim 7, characterized in that the antioxidant material is selected from nickel, chromium, gold, or an alloy of these materials.

* * * * *